(12) United States Patent
Lin

(10) Patent No.: US 7,796,364 B2
(45) Date of Patent: Sep. 14, 2010

(54) CURRENT-PERPENDICULAR-TO-PLANE SENSOR EPITAXIALLY GROWN ON A BOTTOM SHIELD

(75) Inventor: Tsann Lin, Saratoga, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 781 days.

(21) Appl. No.: 11/618,527

(22) Filed: Dec. 29, 2006

(65) Prior Publication Data

US 2008/0158741 A1 Jul. 3, 2008

(51) Int. Cl.
*G11B 5/39* (2006.01)
(52) U.S. Cl. .............. 360/324.11; 360/319; 360/324.2
(58) Field of Classification Search .............. 360/319, 360/324.1, 324.11, 324.12, 324.2
See application file for complete search history.

(56) References Cited

U.S. PATENT DOCUMENTS

| | | | |
|---|---|---|---|
| 6,466,419 B1 | 10/2002 | Mao | |
| 6,490,140 B1 | 12/2002 | Mao et al. | |
| 6,538,856 B1 | 3/2003 | Gill | |
| 6,731,477 B2 | 5/2004 | Lin et al. | |
| 6,791,806 B1 | 9/2004 | Gao et al. | |
| 6,867,953 B2 | 3/2005 | Gill | |
| 2002/0051330 A1 | 5/2002 | Heijden et al. | |
| 2005/0063103 A1 | 3/2005 | Ding et al. | |
| 2005/0073778 A1* | 4/2005 | Hasegawa et al. | 360/324.1 |
| 2005/0201022 A1 | 9/2005 | Horng et al. | |
| 2005/0213258 A1 | 9/2005 | Gill | |
| 2005/0213264 A1 | 9/2005 | Gill | |
| 2005/0238924 A1* | 10/2005 | Gill | 428/837 |
| 2006/0007605 A1 | 1/2006 | Li et al. | |
| 2006/0023373 A1 | 2/2006 | Gill | |
| 2006/0023374 A1* | 2/2006 | Hasegawa et al. | 360/324.11 |

(Continued)

OTHER PUBLICATIONS

K. Shimazawa et al., Frequency Response of Common Lead and Shield Type Magnetic Tunneling Junction Head, IEEE Transactions on Magnetics, vol. 37, No. 4, pp. 1684-1686, Jul. 2001.

(Continued)

*Primary Examiner*—Jefferson Evans
(74) *Attorney, Agent, or Firm*—Patterson & Sheridan, L.L.P.

(57) ABSTRACT

A current-perpendicular-to-plane (CPP) magnetoresistance sensor and a method for forming a current-perpendicular-to-plane (CPP) magnetoresistance sensor. The method includes providing a ferromagnetic shield layer and disposing one or more seed layers on the ferromagnetic shield layer. The method also includes disposing a pinning layer on the one or more seed layers, wherein the pinning layer excludes PtMn, and disposing a pinned layer on the pinning layer. The shield layer, each of the one or more seed layers, the pinning layer, and the pinned layer are comprised of compounds having face-centered-cubic structures.

37 Claims, 12 Drawing Sheets

U.S. PATENT DOCUMENTS

| | | |
|---|---|---|
| 2006/0044708 A1 | 3/2006 | Gill |
| 2006/0061917 A1 | 3/2006 | Gill et al. |
| 2006/0164759 A1* | 7/2006 | Okada et al. ............... 360/126 |
| 2007/0070556 A1* | 3/2007 | Zhang et al. ........... 360/324.11 |
| 2007/0297100 A1* | 12/2007 | Miyajima et al. ...... 360/324.11 |
| 2008/0074804 A1* | 3/2008 | Nishimura et al. ....... 360/324.2 |
| 2008/0088987 A1* | 4/2008 | Nakabayashi et al. .. 360/324.11 |
| 2009/0009913 A1* | 1/2009 | Komagaki ................. 360/319 |

OTHER PUBLICATIONS

Chih-Ling Lee et al., Seed layer characterization for PtMn bottom spin-filter spin valves, Journal of Applied Physics, vol. 93, No. 10, pp. 8406-8408, May 15, 2003, American Institute of Physics.

J. J. Sun et al., Magnetic tunnel junctions on magnetic shield smoothed by gas cluster ion beam, Journal of Applied Physics, vol. 89, No. 11, pp. 6653-6655, Jun. 1, 2001, American Institute of Physics.

* cited by examiner

CURRENT-PERPENDICULAR-TO-PLANE SENSOR EPITAXIALLY GROWN ON A BOTTOM SHIELD

BACKGROUND OF THE INVENTION

1. Field of the Invention

The present invention relates to a current-perpendicular-to-plane (CPP) tunneling magnetoresistance (TMR) or giant magnetoresistance (GMR) sensor, and more particularly to a CPP TMR or GMR sensor epitaxially grown on a bottom shield.

2. Description of the Related Art

The heart of a computer is a non-volatile storage device that is referred to as a magnetic disk drive. The magnetic disk drive includes a magnetic disk as well as write and read heads. The write and read heads are supported by a slider that is mounted on a suspension arm. When the magnetic disk rotates, an actuator swings the suspension arm to place the write and read heads over selected circular tracks on the surface of the rotating magnetic disk. An air flow generated by the rotation of the magnetic disk causes an air bearing surface (ABS) of the slider to fly at a very low elevation (referred to as the fly height) over the surface of the rotating magnetic disk. The write and read heads write magnetic transitions to and read magnetic transitions from the rotating magnetic disk, respectively. Processing circuitry connected to the write and read and heads then operates according to a computer program to implement writing and reading functions.

The write head includes a coil embedded in an insulation stack that is sandwiched between main and auxiliary poles. The main and auxiliary poles are magnetically coupled at a back gap and are coated with an overcoat. A write current conducted to the coil induces a magnetic flux in the main pole that causes a magnetic field to write the aforementioned magnetic impressions to the rotating magnetic disk.

The read head includes a sensor electrically connected with top and bottom electrodes, but electrically insulated by insulating films from bias stacks at two side regions. A sense current conducted through the top electrode, sensor, and bottom electrode causes changes of resistance in response to external magnetic fields of magnetic transitions from the rotating magnetic disk.

In some cases, the performance of the sensor may be degraded due to temperature increases during sensor processing or manufacturing. To prevent the sensor from this performance degradation, there is a desire to improve the thermal stability of the sensor. Accordingly, what is needed are a sensor and method for providing the sensor with improved thermal stability.

SUMMARY OF THE INVENTION

Embodiments of the invention generally provide a current-perpendicular-to-plane (CPP) magnetoresistance sensor and a method for forming a current-perpendicular-to-plane (CPP) magnetoresistance sensor. In one embodiment, the method includes providing a ferromagnetic shield layer and disposing one or more seed layers on the ferromagnetic shield layer. The method also includes disposing a pinning layer on the one or more seed layers, wherein the pinning layer excludes PtMn, and disposing a pinned layer on the pinning layer. The shield layer, each of the one or more seed layers, the pinning layer, and the pinned layer are comprised of compounds having face-centered-cubic structures.

One embodiment of the invention provides a current-perpendicular-to-plane (CPP) magnetoresistance sensor including a ferromagnetic shield layer and one or more seed layers disposed on the ferromagnetic shield layer. The sensor also includes a pinning layer disposed on the one or more seed layers, wherein the pinning layer excludes PtMn, and a pinned layer disposed on the pinning layer. The shield layer, each of the one or more seed layers, the pinning layer, and the pinned layer are comprised of compounds having face-centered-cubic structures.

One embodiment of the invention also provides a current-perpendicular-to-plane (CPP) giant magnetoresistance (GMR) sensor includes a ferromagnetic shield layer, one or more seed layers disposed on the ferromagnetic shield layer, and a pinning layer disposed on the seed layers, wherein the pinning layer excludes PtMn. The sensor also includes a pinned layer disposed on the pinning layer, a spacer layer disposed on the pinned layer, a free layer disposed on the spacer layer, and a cap layer disposed on the free layer. The shield layer, each of the one or more seed layers, the pinning layer, and the pinned layer comprise compounds having face-centered-cubic structures.

One embodiment of the invention provides a current-perpendicular-to-plane (CPP) tunneling magnetoresistance (TMR) sensor. The sensor includes a ferromagnetic shield layer, one or more seed layers disposed on the ferromagnetic shield layer, and a pinning layer disposed on the seed layers, wherein the pinning layer excludes PtMn. The sensor also includes a pinned layer disposed on the pinning layer, a barrier layer disposed on the pinned layer, a free layer disposed on the barrier layer, and a cap layer disposed on the free layer. The shield layer, each of the one or more seed layers, the pinning layer, and the pinned layer comprise compounds having face-centered-cubic structures.

Another embodiment of the invention provides a magnetic storage system including a magnetic storage medium having a plurality of tracks for recording data and a current-perpendicular-to-plane (CPP) magnetoresistance sensor. The sensor includes a ferromagnetic shield layer, one or more seed layers disposed on the ferromagnetic shield layer, and a pinning layer disposed on the one or more seed layers, wherein the pinning layer excludes PtMn. The sensor also includes a pinned layer disposed on the pinning layer. The shield layer, each of the one or more seed layers, the pinning layer, and the pinned layer comprise compounds having face-centered-cubic structures.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and, unless explicitly present, are not considered elements or limitations of the appended claims.

An Exemplary Hard Drive

Figure 1:
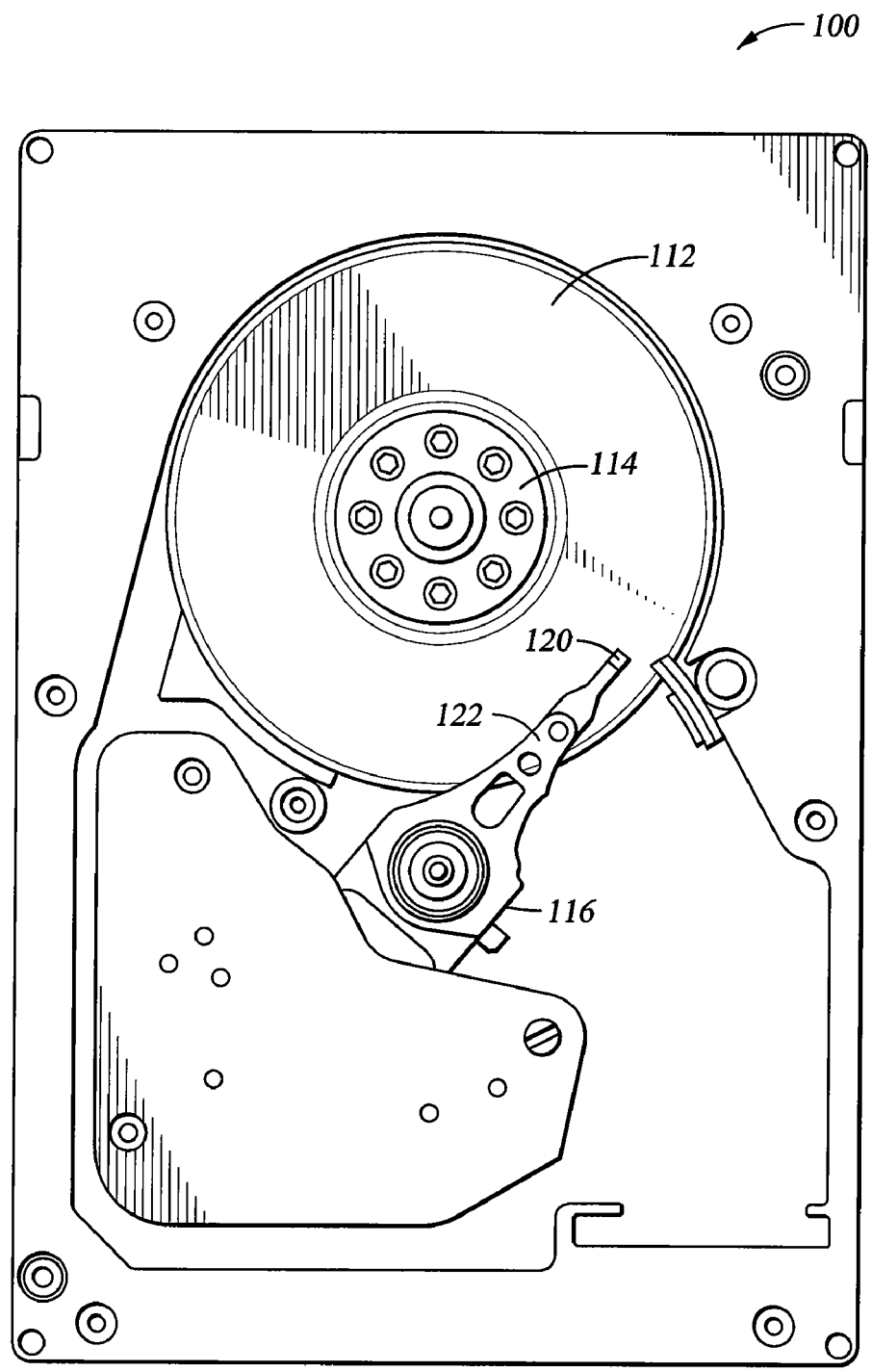
FIG. 1 is a block diagram depicting a hard drive according to one embodiment of the invention.

FIG. 1 is a block diagram depicting a hard drive 100 according to one embodiment of the invention. The hard disk drive 100 includes a magnetic media hard disk 112 mounted upon a motorized spindle 114. An actuator arm 116 is pivotally mounted within the hard disk drive 100 with a slider 120 disposed upon a distal end 122 of the actuator arm 116. During operation of the hard disk drive 100, the hard disk 112 rotates upon the spindle 114 and the slider 120 acts as an air-bearing surface (ABS) adapted for flying above the surface of the disk 112. The slider 120 includes a substrate base upon which various layers and structures that form a magnetoresistive sensor, described in greater detail below, are fabricated.

Layers of a Tunneling Magnetoresistance (TMR) Sensor

Figure 2:
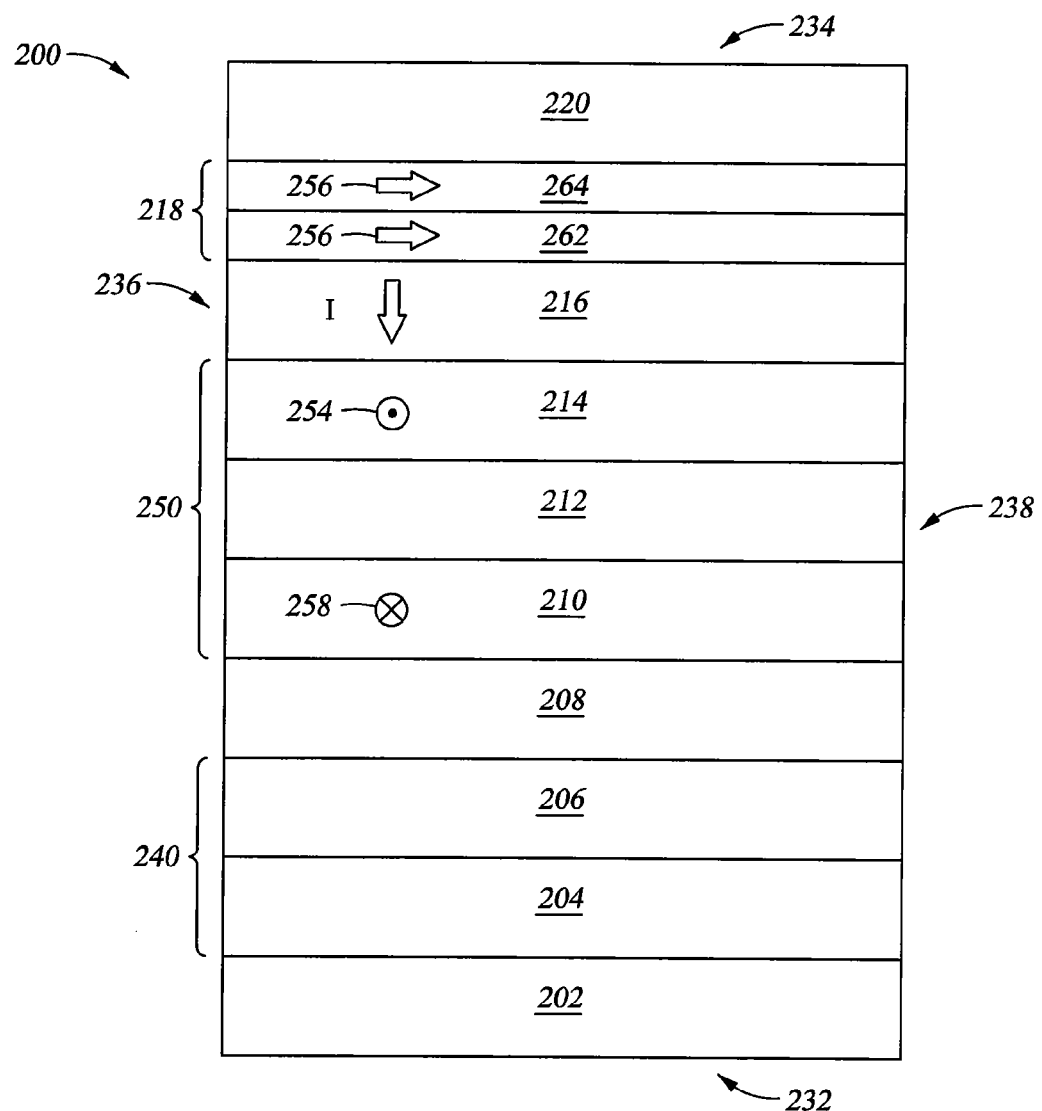
FIG. 2 is a block diagram depicting the structure of a current perpendicular-to-plane (CPP) tunneling magnetoresistive (TMR) sensor according to one embodiment of the invention.

FIG. 2 is a block diagram depicting exemplary layers of a typical current-perpendicular-to-plane (CPP) tunneling magnetoresistance (TMR) sensor 200 according to one embodiment of the invention. As depicted, the TMR sensor 200 may comprise a bottom shield 202, one or more seed layers 240, a pinning layer 208, a flux-closure stack 250, a barrier layer 216, a sense layer 218, and a cap layer 220. The TMR sensor 200 may include a bottom side 232, a top side 234, a front side 236 facing an air-bearing surface (ABS), and a back side 238. As described below, the seed layers 240 may be used to provide a microstructural base upon which other layers of the TMR sensor 200 are deposited. Also, as described below, the composition of the seed layers 240 may affect magnetic and TMR properties of the other layers deposited on the seed layers 240.

In one embodiment, the flux-closure stack 250 may comprise keeper and reference layers (210 and 214) separated by an antiparallel (AP) coupling layer 212. The keeper layer 210 may have a magnetization 258 in a given direction defined by the pinning layer 208. The reference layer 214 may have a magnetization 254 in a direction antiparallel to the given direction. Both the magnetizations 258 and 254 are rigidly pinned due to strong antiferromagnetic coupling energy provided by the pinning layer 208 and strong antiparallel coupling energy provided by the AP coupling layer 212. This rigid pinning facilitates proper operation of the TMR sensor 200.

The TMR sensor 200 is typically annealed in a magnetic field in the predetermined direction 258 to thermally set the antiferromagnetism of the pinning layer 208, thereby rigidly pinning the magnetization 258 of the keeper layer 210 through exchange coupling between the pinning layer 208 and the keeper layer 210, and the magnetization 254 of the reference layer 214 through antiparallel coupling across the AP coupling layer 212. To ensure the rigid pinning for proper sensor operation, a high pinning field induced by strong exchange and antiparallel coupling is typically desired in the TMR sensor 200.

In one embodiment, to achieve strong exchange and antiparallel coupling, the pinning layer 208 may be made of an antiferromagnetic Ir—Mn-based film, the keeper and reference layers 210 and 214 may be made of Co—Fe-based films, and the AP coupling layer 212 may be made of a Ru film. In one embodiment, the pinning layer 208 has an Ir content of 22 atomic percent (at %), a Mn content of 75 at %, and a Cr content of 3 at %. The keeper layers 210 may have a Co content of 75 at % and an Fe content of 25 at %, and the reference layer 214 may have a Co content of 51 at %, an Fe content of 34 at %, and a B content of 15 at %. While described above with respect to layers of specific thicknesses and compositions, it should be apparent to those of ordinary skill in the art that embodiments of the invention may be used with any ordering of layers, with layers of any composition, and with layers of any desired thickness.

The sense layer 218 of the TMR sensor 200 may have a magnetization 256 which can be rotated by external magnetic fields. In one embodiment, the sense layer 218 may be made of a ferromagnetic Co—Fe-based film. For example, the sense layer 218 may comprise lower and upper portions 262, 264. The lower portion 262 of the sense layer 218 may be formed of a Co—Fe—B film having a Co content of 60 at %, an Fe content of 20 at %, and a B content of 20 at % which may provide improved TMR properties. The upper portion 264 of the sense layer 218 may be formed of a Co—Fe—B film, having a Co content of 72 at %, an Fe content of 8 at %, and a B content of 20 at % which may provide improved ferromagnetic properties. The TMR sensor 200 may be coated with a cap layer 220, formed of a Ru or Ta film for protecting the TMR sensor 200 during subsequent processing.

During sensor operation in magnetic fields representing data stored on a magnetic disk 112, a sense current I tunneling through the barrier layer 216 of the TMR sensor 200 in a direction perpendicular to the planes of the TMR sensor 200 may be used to detect a resistance change and sense a TMR effect. When the magnetic fields cause the magnetization 256 of the sense layer 218 to rotate from a direction parallel to the magnetization 254 of the reference layer 214 to a direction antiparallel to the magnetization 254 of the reference layer 214, the junction resistance may increase from a first resistance value $R_J$ to a second resistance value $R_J + \Delta R_T$. The TMR effect is characterized by a TMR coefficient, defined as $\Delta R_T / R_J$. In one embodiment, the barrier layer 216 may be formed of a magnesium oxide (Mg—O) film. In other embodiments, the barrier layer 216 may be formed of an aluminum oxide (Al—O) or titanium oxide (Ti—O) film.

In one embodiment, the seed layer 240 may provide a microstructural base upon which other layers of the TMR sensor 200 may be epitaxially grown with desired magnetic and TMR properties, as well as high thermal stability. For example, the seed layer 240 may provide substantial grain coarsening and a crystalline texture, thereby inducing a large TMR effect. The seed layer 240 may be made of Ni—Cr—Fe, Ni—Fe, Ru, Cu or Pt film. In one embodiment, the seed layer 240 may comprise a lower seed layer 204 and an upper seed layer 206. The lower seed layer 204 may be formed of a Ni—Cr—Fe film, having a Ni content of 48 at %, a Cr content of 40 at %, and an Fe content of 12 at %. The upper seed layer 206 may be formed of a Ni—Fe film, having a Ni content of 91.5 at % and an Fe content of 8.5 at %.

In one embodiment, to provide a solid microstructural base, the seed layer 240 may have the same structure as the pinning layer 208, for example, a face-centered-cubic (FCC) structure. Thus, in one embodiment, the lower seed layer 204 may be made of a Ni—Cr—Fe film and the upper seed layer 204 may be made of a Ni—Fe film, which both provide the FCC structure. As a result, epitaxial growth of subsequent layers in the sensor may provide large polycrystalline grains in the subsequent layers of the TMR sensor 200. With few or no grain boundaries after patterning into a small dimension of the layers, the TMR sensor 200 may exhibit good magnetic and TMR properties, as well as high thermal stability.

In one embodiment, the bottom shield 202 may be made of a Ni—Fe film which also have the FCC structure and which may be as thick as 1,000 nm. Because the bottom shield 202 may have the FCC structure, the bottom shield 202 may be considered a thick seed layer upon which other layers are deposited. In one embodiment, by depositing subsequent layers which have only an FCC structure, the benefits described above may be obtained. Furthermore, in one embodiment, subsequently deposit layers between the bottom shield 202 and the barrier layer 216 may not include tantalum (Ta) which has a body-centered-cubic (BCC) structure and may reduce the benefits obtained from only depositing layers with the FCC structure.

In one embodiment, the TMR sensor 200 may include a lower seed layer 204 made of a 2 nm thick 48Ni-40Cr-12Fe film (which is directly deposited on top of the bottom shield 202 made of a 1,000 nm thick Ni—Fe film), an upper seed layer 206 made of a 0.8 nm thick 91.5Ni-8.5Fe film, a pinning layer 208 made of a 6 nm thick 22Ir-75Mn-3Cr film, a keeper layer 210 made of a 2.1 nm thick 75Co-25Fe film, an AP coupling layer 212 made of a 0.43 nm thick Ru film, a reference layer 214 made of a 1.9 nm thick 51Co-34Fe-15B film, a barrier layer 216 made of a 0.85 nm thick Mg—O film, a lower sense layer 262 made of a 60Co-20Fe-20B film, an upper sense layer 264 made of a 72Co-8Fe-20B film, and a cap 220 made of a 6 nm thick Ru film. While described above with respect to layers of specific thicknesses and compositions, it should be apparent to those of ordinary skill in the art that embodiments of the invention may be used with any ordering of layers, with layers of any composition, and with layers of any desired thickness.

Figure 3:
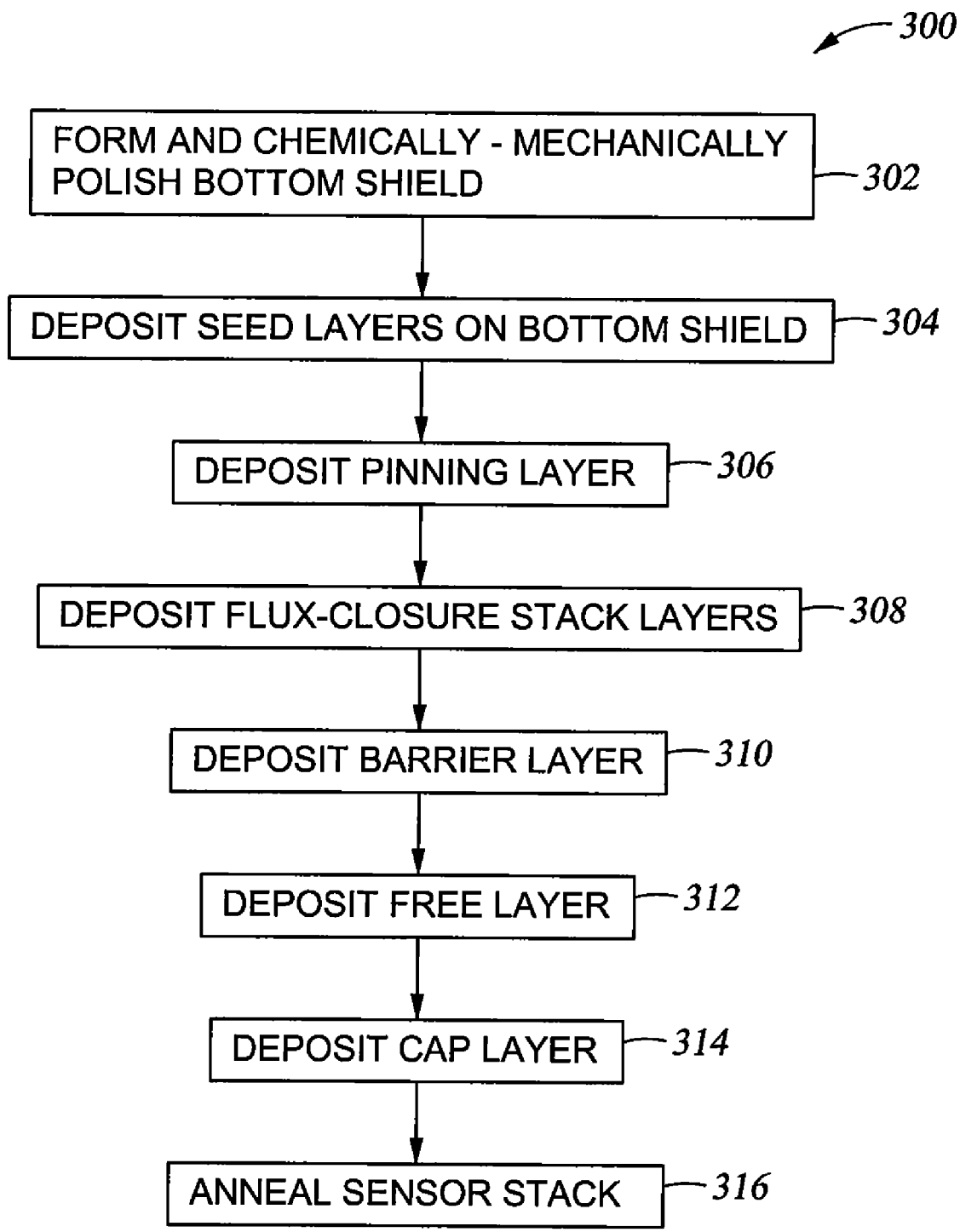
FIG. 3 is a flow diagram depicting a method for forming a CPP TMR sensor according to one embodiment of the invention.

FIG. 3 is a block diagram depicting a process 300 for manufacturing a TMR sensor 200 according to one embodiment of the invention. As depicted, the process 300 may begin at step 302 where the bottom shield 202 made of a 2,000 nm thick Ni—Fe film is formed and chemically-mechanically polished (CMP). In one embodiment, during the formation process of the Ni—Fe bottom shield 202, a seed layer made of an 80 nm thick Ni—Fe film is sputtered on a wafer. A bottom shield frame is formed with photolithographic patterning, and a 2,400 nm thick Ni—Fe film is then electroplated into the bottom shield frame. In one embodiment, during the CMP process, the photoresist and the Ni—Fe seed layer outside of the bottom shield frame are removed, a 2,400 nm thick $Al_2O_3$ film is deposited, and CMP is then applied until a smooth 2,000 nm thick lower shield 202 is formed.

At step 304, seed layers 204 and 206 may be deposited on the bottom shield 202. At step 306, a pinning layer 208 may be deposited on the upper seed layer 206. Then, at step 308, the flux-closure stack 250 may be deposited on the pinning layer 208. At step 310, the barrier layer 216 may be deposited on the flux-closure stack 250. At step 312, the sense layer 218 may be deposited on the barrier layer 216. Then, at step 314, the cap layer 220 may be deposited on the sense layer 218. At step 316, the TMR sensor 200 may be annealed. In one embodiment, annealing may be performed for 5 hours at 285 degrees C in a field of 50,000 Oe in a vacuum oven. With respect to each of the deposition steps described above, any deposition method known to those of skill in the art may be used, including DC magnetron sputtering, ion-beam sputtering, etc.

In one embodiment, during the process 300 for manufacturing the TMR sensor 200, the Ni—Fe seed layer 206 may provide a high-conductance path for electroplating, instead of controlling the grain growth in the electroplated Ni—Fe bottom shield 202. The Ni—Fe bottom shield 202 may thus exhibit its own equal-axial grains with various sizes independent of the Ni—Fe seed layer 206 and the film thickness. In some cases, the TMR sensor 200 deposited on these grains with various sizes may exhibit TMR properties tightly distributed over the 5" diameter wafer. Optionally, in some cases, the grain sizes may be controlled during the process 300 to further ensure uniform distribution of the TMR properties.

In one embodiment, to ensure uniform grain-size distribution, a 3 nm thick Ta block layer can be sputtered to block the electroplated Ni—Fe film after the CMP process, and a Ni—Fe film, as thick as up to 400 nm, can be sputtered on top of the Ta block layer. This sputtered Ni—Fe film may exhibit desired columnar grains which nucleate on the Ta block layer and grow to a uniform size, and may also exhibit soft anisotropic ferromagnetic properties. In some cases, if the sputtering process continues to attain a Ni—Fe film thickness exceeding 400 nm, grains may grow to various sizes due to heat-induced grain boundary coalescence, and thus the ferromagnetic properties may deteriorate. Therefore, in one embodiment, the single electroplated Ni—Fe film may be replaced with laminated Ta/Ni—Fe films which may be deposited via sputtering, where each Ni—Fe laminate has a thickness of no more than 400 nm. In one embodiment, to improve the smoothness of the sputtered Ni—Fe film, nitrogen can be incorporated into the sputtering process for the surface smoothness, or the CMP process can be applied again to remove unwanted grain boundary grooving.

Layers of a CPP Giant Magnetoresistive (GMR) Sensor

Figure 4:
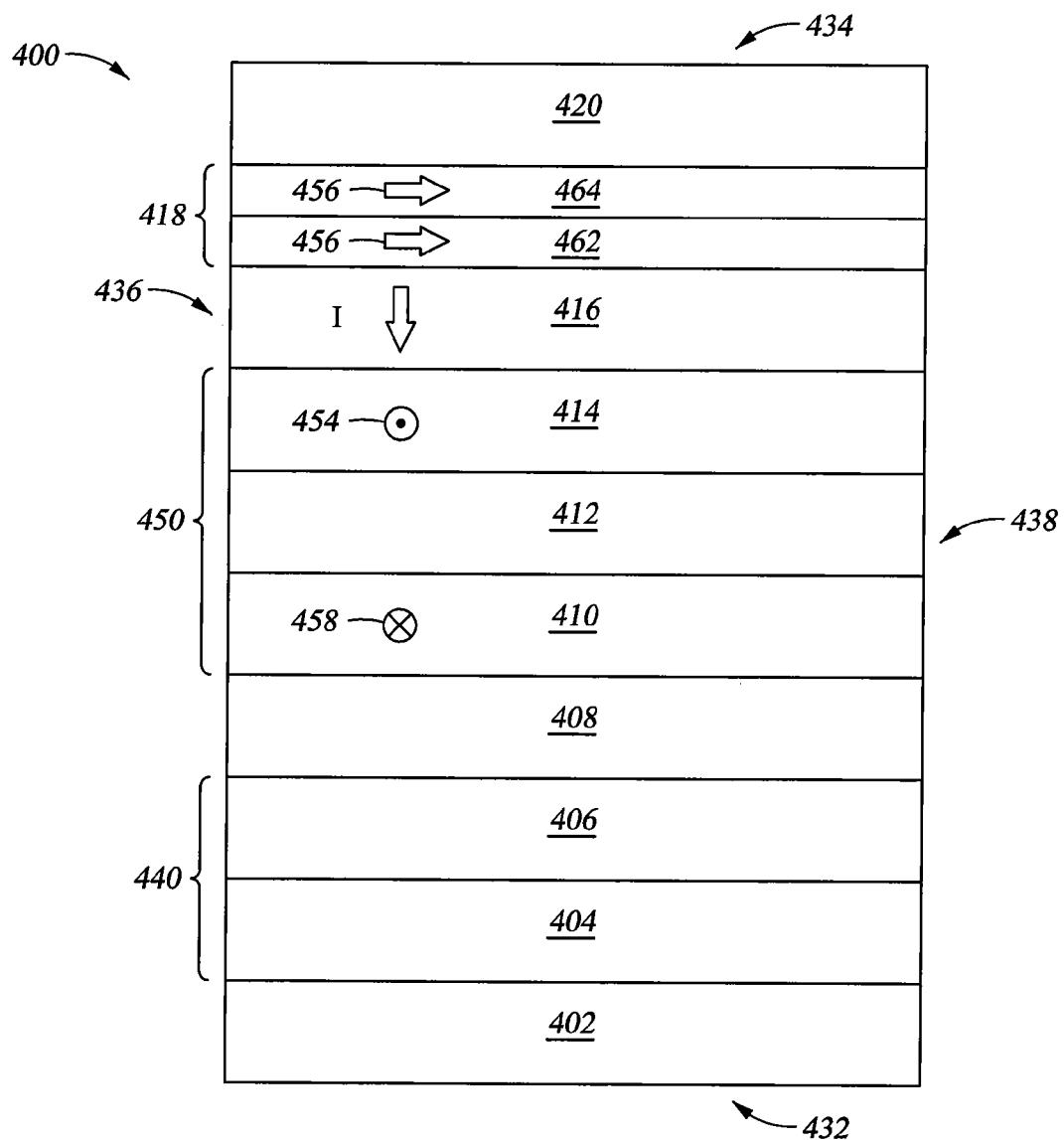
FIG. 4 is a block diagram depicting the structure of a CPP giant magnetoresistive (GMR) sensor according to one embodiment of the invention.

FIG. 4 is a block diagram depicting exemplary layers of a typical current-perpendicular-to-plane (CPP) giant magnetoresistance (GMR) sensor 400 according to one embodiment of the invention. As depicted, the CPP GMR sensor 400 may comprise a bottom shield 402, one or more seed layers 440, a pinning layer 408, a flux-closure stack 450, a spacer layer 416, a sense layer 418, and a cap layer 420. The CPP GMR sensor 400 may include a bottom side 432, a top side 434, a front side 436 facing an air-bearing surface (ABS), and a back side 438. As described below, the seed layers 440 may be used to provide a microstructural base upon which other layers of the TMR sensor 400 are deposited. Also, as described below, the composition of the seed layers 440 may affect magnetic and CPP GMR properties of the other layers deposited on the seed layers 440.

During sensor operation in magnetic fields representing data stored on a magnetic disk 112, a sense current I flowing through the spacer layer 416 of the CPP GMR sensor 400 in a direction perpendicular to the planes of the CPP GMR sensor 400 may be used to detect a resistance change and sense a CPP GMR effect in the sensor 400. For example, when the magnetic fields cause the magnetization 456 of the sense layer 418 to rotate from a direction parallel to the magnetization 454 of the reference layer 414 to a direction antiparallel to the magnetization 454 of the reference layer 214, the junction resistance may increase from $R_J$ to $R_J+\Delta R_G$. The CPP GMR effect is characterized by a CPP GMR coefficient, defined as $\Delta R_G/R_J$. In one embodiment, the spacer layer 416 may be formed of a copper oxide (Cu—O) film. Other aspects of the CPP GMR sensor 400 such as the compositions of rest of the CPP GMR sensor 400 may be similar or identical to those described above with respect to the TMR sensor 200.

Figure 5:
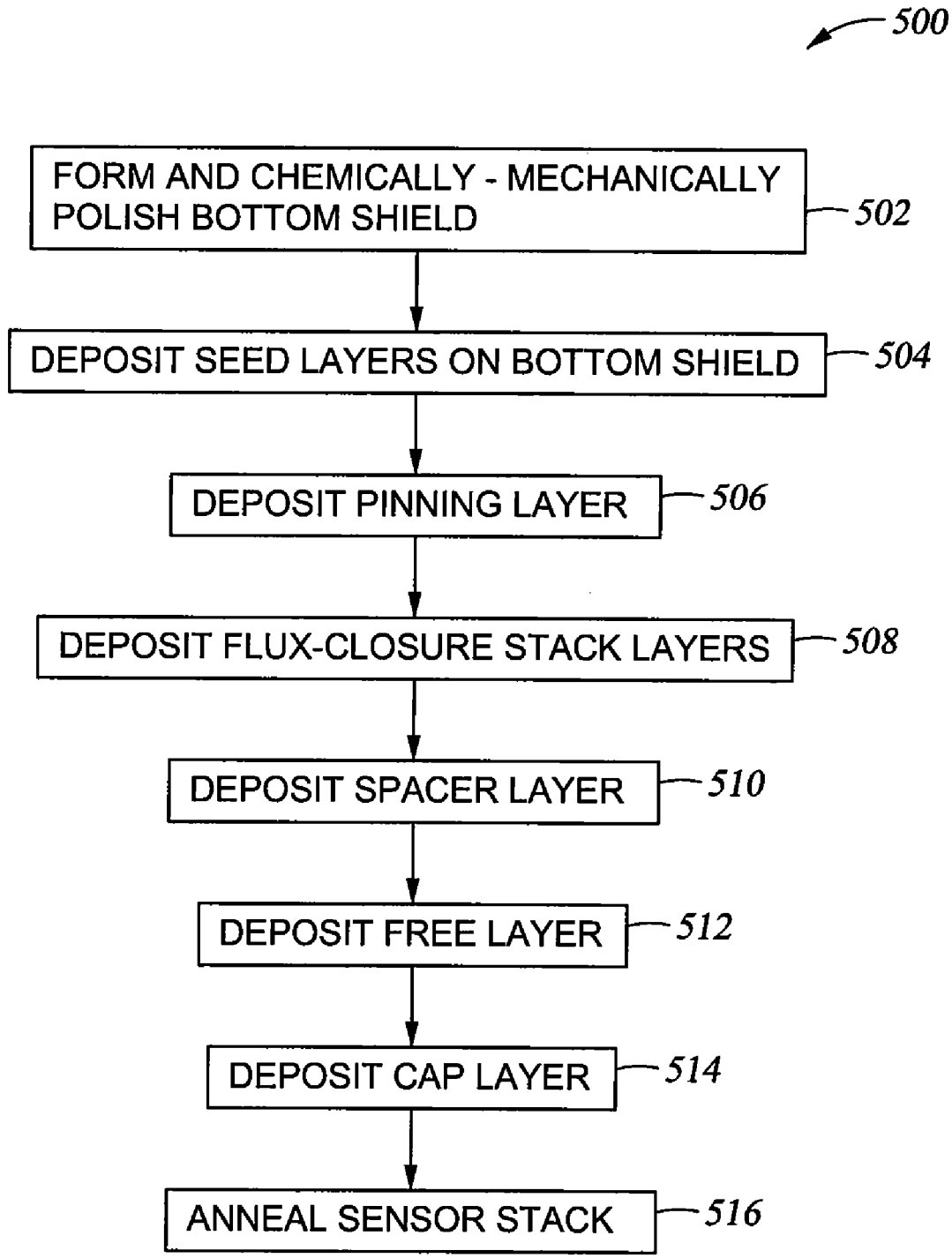
FIG. 5 is a flow diagram depicting a method for forming a CPP GMR sensor according to one embodiment of the invention.

FIG. 5 is a block diagram depicting a process 500 for manufacturing a CPP GMR sensor 400 according to one embodiment of the invention. As depicted, the process 500 may begin at step 502 where the lower shield 402 made of a 2,000 nm thick Ni—Fe film is formed and chemically-mechanically polished (CMP). In one embodiment, during the formation process of the Ni—Fe bottom shield, a seed layer made of an 80 nm thick Ni—Fe film is sputtered on a wafer. A bottom shield frame is formed with photolithographic patterning, and a 2,400 nm thick Ni—Fe film is then electroplated into the bottom shield frame. In one embodiment, in the CMP process, the photoresist and the Ni—Fe seed layer outside of the bottom shield frame are removed, a 2,400 nm thick $Al_2O_3$ film is deposited, and CMP then applied until a smooth 2,000 nm thick lower shield 402 is formed. At step 504, seed layers 404 and 406 may be deposited on the bottom shield 402. At step 506, a pinning layer 408 may be deposited on the upper seed layer 406. Then, at step 508, the flux-closure stack 450 may be deposited on the pinning layer 408. At step 510, the barrier layer 416 may be deposited on the flux-closure stack 450. At step 512, the sense layer 418 may be deposited on the barrier layer 416. Then, at step 514, the cap layer 420 may be deposited on the sense layer 418. At step 516, the CPP GMR sensor 400 may be annealed. In one embodiment, annealing may be performed for 5 hours at 285 degrees C. in a field of 50,000 Oe in a vacuum oven. With respect to each of the deposition steps described above, any deposition method known to those of skill in the art may be used, including DC magnetron sputtering, ion-beam sputtering, etc. The process 500 can be further performed in the same ways as described with respect to the process 300.

Exemplary Sensor Characteristics

FIGS. 6A-G depict experimental results of a TMR sensor fabricated according to one embodiment of the invention in contrast with a conventional TMR sensor. The TMR sensors used in one embodiment include Ni—Cr—Fe(2)/Ni—Fe(0.8)/Ir—Mn—Cr(6)/Co—Fe(2.1)/Ru(0.43)/Co—Fe—B(1.9)/Mg—O/Co—Fe—B(4)/Ru(6) films (thickness in nm). Two exemplary types of the TMR sensors are depicted in the graphs, one with and the other without a 3 nm thick Ta block layer. Each of the sensors depicted are deposited on a chemically-mechanically polished 2,000 nm thick Ni—Fe bottom shield, and then annealed for 5 hours at 285° C. in 50,000 Oe in a vacuum oven. Without performing photolithographic patterning, the junction resistance-area product ($R_JA_J$) and the TMR coefficient ($\Delta R_T/R_J$) of the TMR sensors are measured with a current-in-plane tunneling technique.

Figure 6A:
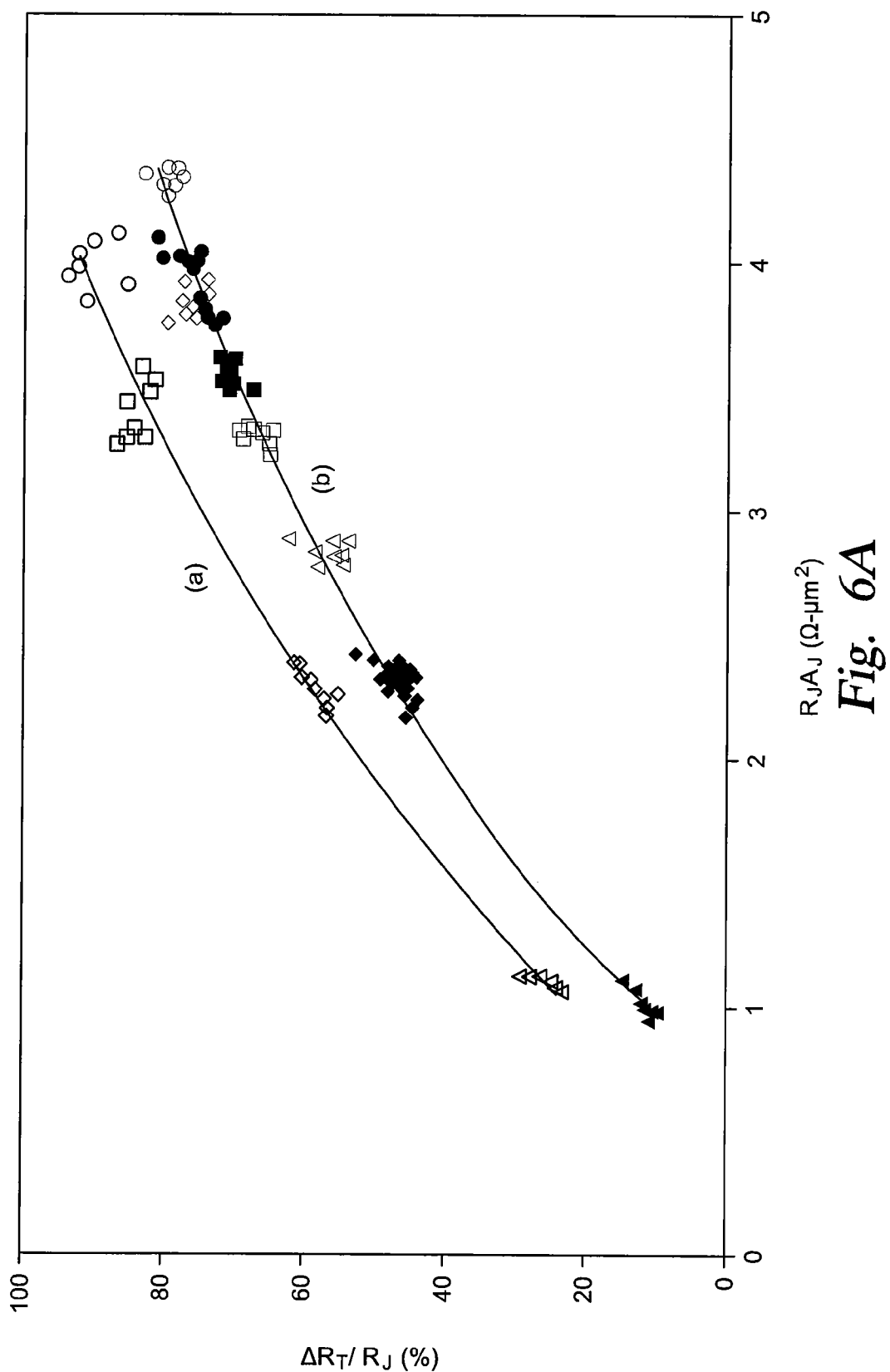
FIG. 6A is a graph of the TMR coefficient over the junction resistance-area product for CPP TMR sensors according to one embodiment of the invention.

FIG. 6A shows the TMR coefficient ($\Delta R_T/R_J$) versus the junction resistance-area product ($R_JA_J$) for (a) a TMR sensor 200 according to one embodiment of the invention and (b) a conventional TMR sensor. $\Delta R_T/R_J$ and $R_JA_J$ are measured with a current-in-plane tunneling technique. As depicted in FIG. 6A, as the thickness of the Mg—O barrier layer 216 increases from 0.85 to 1.05 nm, the junction resistance-area product ($R_JA_J$) increases from 1.0 to 4.3 $\Omega$-$\mu m^2$ and the TMR coefficient ($\Delta R_T/R_J$) increases from 11.9 to 79.4% for the conventional TMR stack, while $R_JA_J$ increases from 1.1 to 4.0 $\Omega$-$\mu m^2$ and $\Delta R_T/R_J$ increases from 26.1 to 90.7% for the TMR stack according to one embodiment of the invention. With the Mg—O barrier layer 216 of 1 nm in thickness for a conservatively designed $R_JA_J$ of 3.4 $\Omega$-$\mu m^2$, the epitaxially growth exhibited by the multiple layers with an identical FCC structure an increase in $\Delta R_T/R_J$ 67.0 to 83.6%.

The TMR sensors are then patterned into 700 nm diameter round TMR sensors. The ferromagnetic coupling field ($H_F$, the shift of a sense-layer hysteresis loop), pinning field ($H_{90}$, where $\Delta R_T/R_J$ decreases to 90% of its original value), $R_JA_J$ and $\Delta R_T/R_J$ are measured with a four-point probe.

Figure 6B:
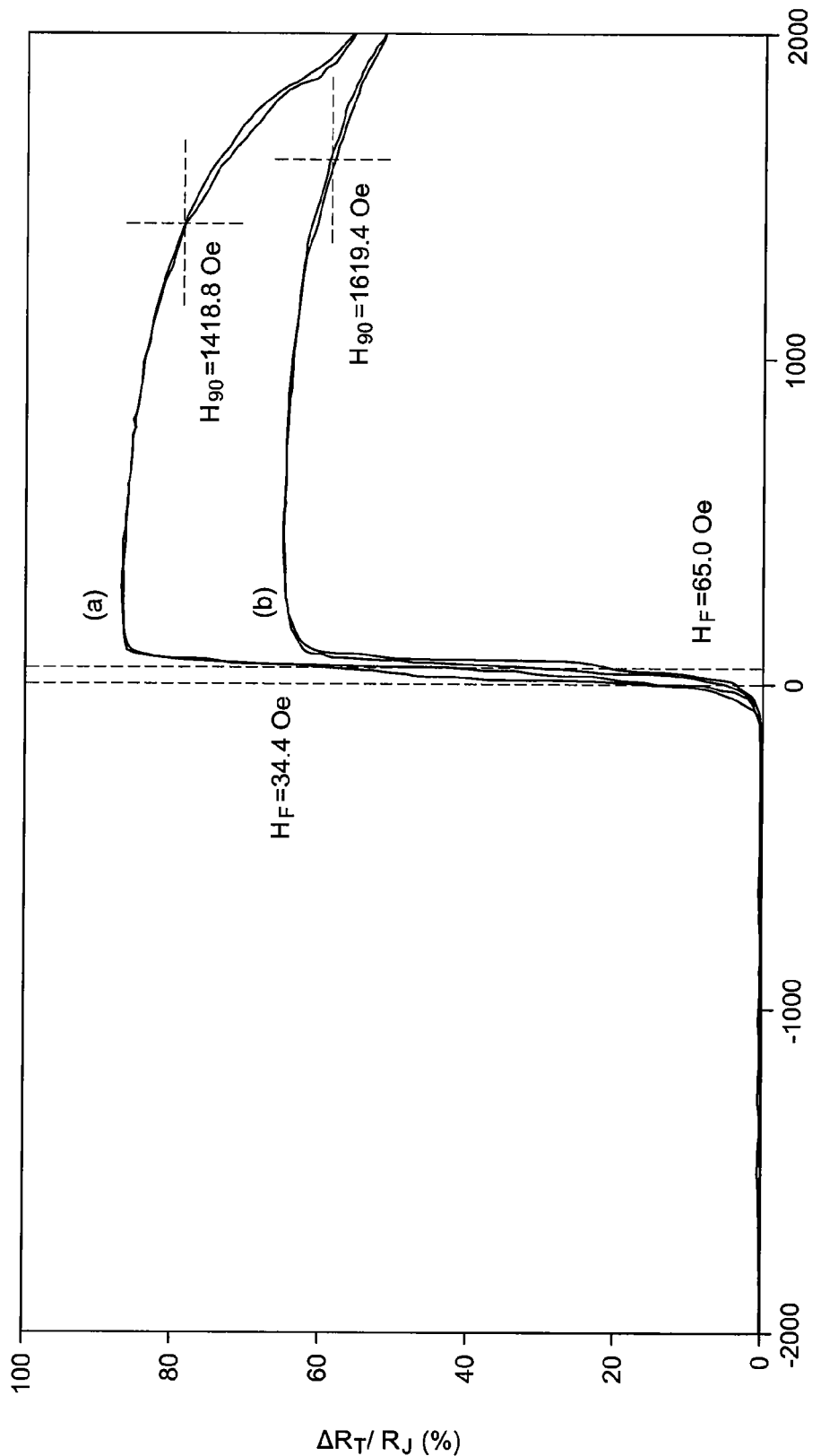
FIG. 6B is a graph of the TMR coefficient over the pinned magnetic field for CPP TMR sensors according to one embodiment of the invention.

FIG. 6B shows magnetic responses of (a) a TMR sensor 200 according to one embodiment of the invention, and (b) a conventional TMR sensor. The field (H) is applied in the easy-axis direction of the Co—Fe keeper layer 210 and the Co—Fe—B reference layer 214. The ferromagnetic coupling field ($H_F$, the shift of a sense-layer hysteresis loop), pinning field ($H_{90}$, where the TMR coefficient $\Delta R_T/R_J$ decreases to 90% of its original value), the junction resistance-area product ($R_JA_J$), and the TMR coefficient ($\Delta R_T/R_J$) are measured with a four-point probe. The epitaxially growth exhibited by the multiple layers with an identical FCC structure causes a decrease in $H_F$ from 65.0 to 34.4 Oe, a decrease in $H_{90}$ from 1619.4 to 1418.8 Oe, and an increase in $\Delta R_T/R_J$ from 65.2 to 87.3%. In spite of the lower $H_{90}$, the TMR sensors according to one embodiment of the invention in fact still exhibits $\Delta R_T/R_J$ at $H_{90}$ of as high as 78.6%, indicating strong pinning desired for proper sensor operation.

Figure 6C:
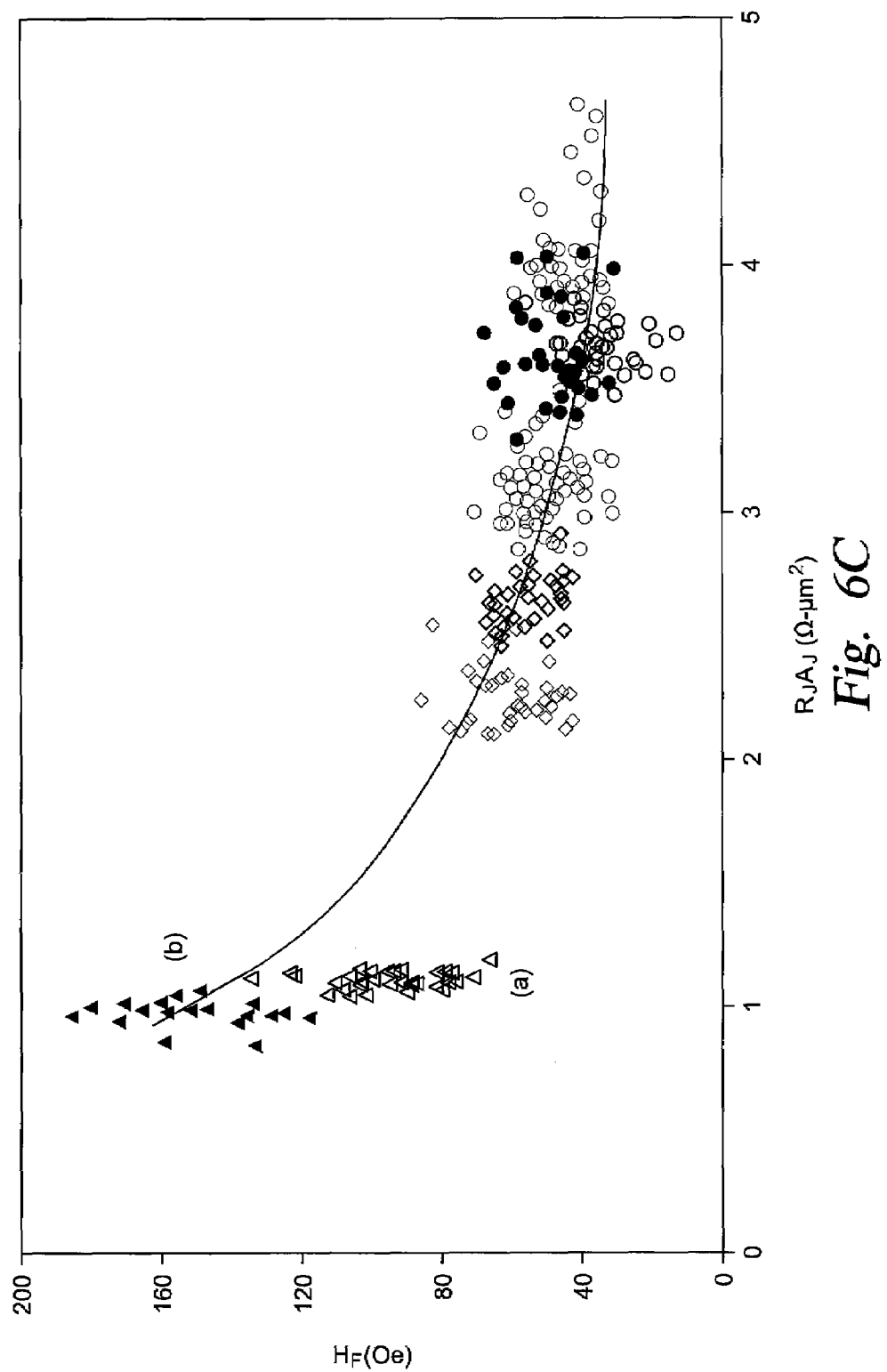
FIG. 6C is a graph of the ferromagnetic coupling field over junction resistance-area product for CPP TMR sensors according to one embodiment of the invention.
Figure 6D:
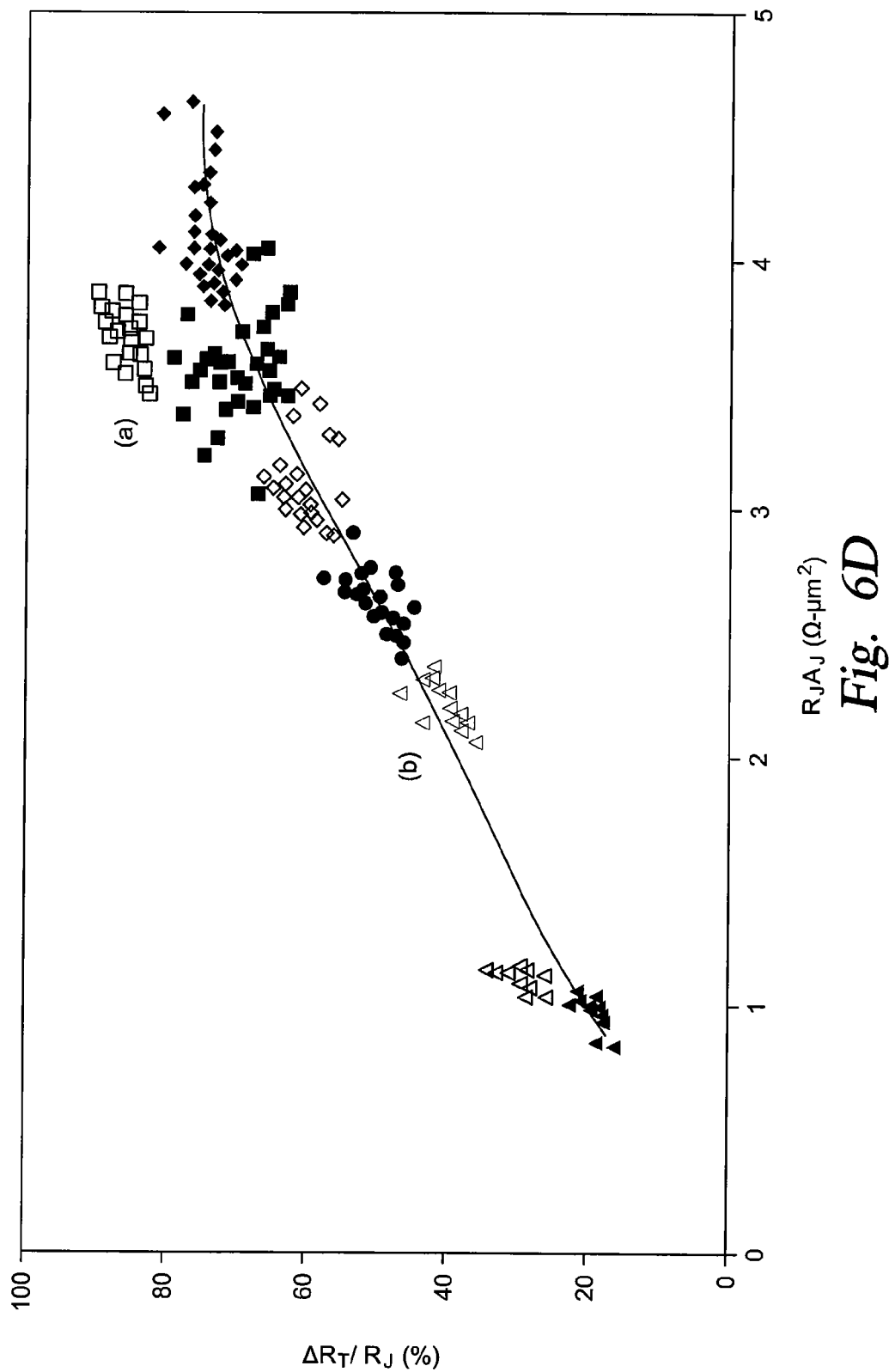
FIG. 6D is a graph of the TMR coefficient over junction resistance-area product for CPP TMR sensors according to one embodiment of the invention.
Figure 6E:
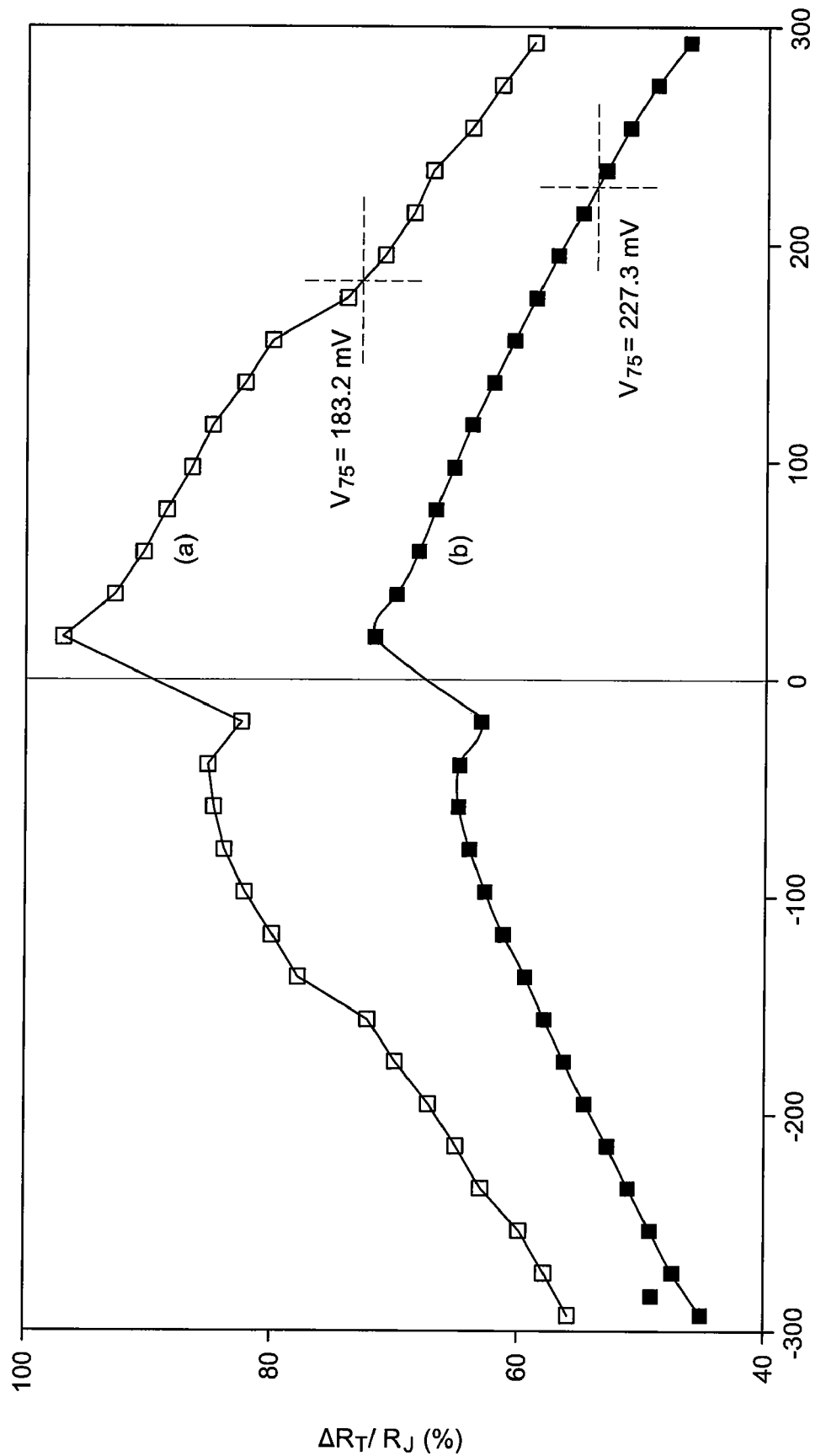
FIG. 6E is a graph of the ferromagnetic coupling field over junction resistance-area product for CPP TMR sensors according to one embodiment of the invention.

FIG. 6C shows a graph of the ferromagnetic coupling field ($H_F$) versus the junction resistance-area product ($R_JA_J$) for (a) a TMR sensor according to one embodiment of the invention, and (b) a conventional TMR sensor. FIG. 6D shows a graph of the TMR coefficient ($\Delta R_T/R_J$) versus the junction resistance-area product ($R_JA_J$) for (a) a TMR sensor according to one embodiment of the invention, and (b) a conventional TMR sensor. FIG. 6E is a graph of the ferromagnetic coupling field ($H_F$) over junction resistance-area product ($R_JA_J$) provided for (a) a TMR sensor according to one embodiment of the invention, and (b) a conventional TMR sensor. As the thickness of the Mg—O barrier layer 216 increases from 0.85 to 1.05 nm, $R_JA_J$ increases from 1.0 to 4.4 $\Omega$-$\mu m^2$, $H_F$ decreases from 150.9 to 38.1 Oe, and $\Delta R_T/R_J$ increases from 18.4 to 76.3% for the conventional TMR sensor, while $R_JA_J$ increases from 1.1 to 3.7 $\Omega$-$\mu m^2$, $H_F$ decreases from 95.6 to 33.4 Oe, and $\Delta R_T/R_J$ increases from 27.9 to 87.2% for the TMR sensor formed according to one embodiment of the invention, as depicted in FIGS. 6C-E.

With the Mg—O barrier layer 216 of 0.85 nm in thickness for an aggressively designed $R_JA_J$ of 1 $\Omega$-$\mu m^2$, the epitaxial growth provided by the multiple layers with an identical FCC structure causes a decrease in $H_F$ from 150.9 to 95.6 Oe and an increase in $\Delta R_T/R_J$ from 18.4 to 27.9%. The substantial decrease in $H_F$ and the substantial increase in $\Delta R_T/R_J$ indicate that the TMR sensor formed according to one embodiment of the invention will be still viable after a sensor miniaturization process, and thus will play an important role in magnetic recording at ultrahigh densities.

Figure 6F:
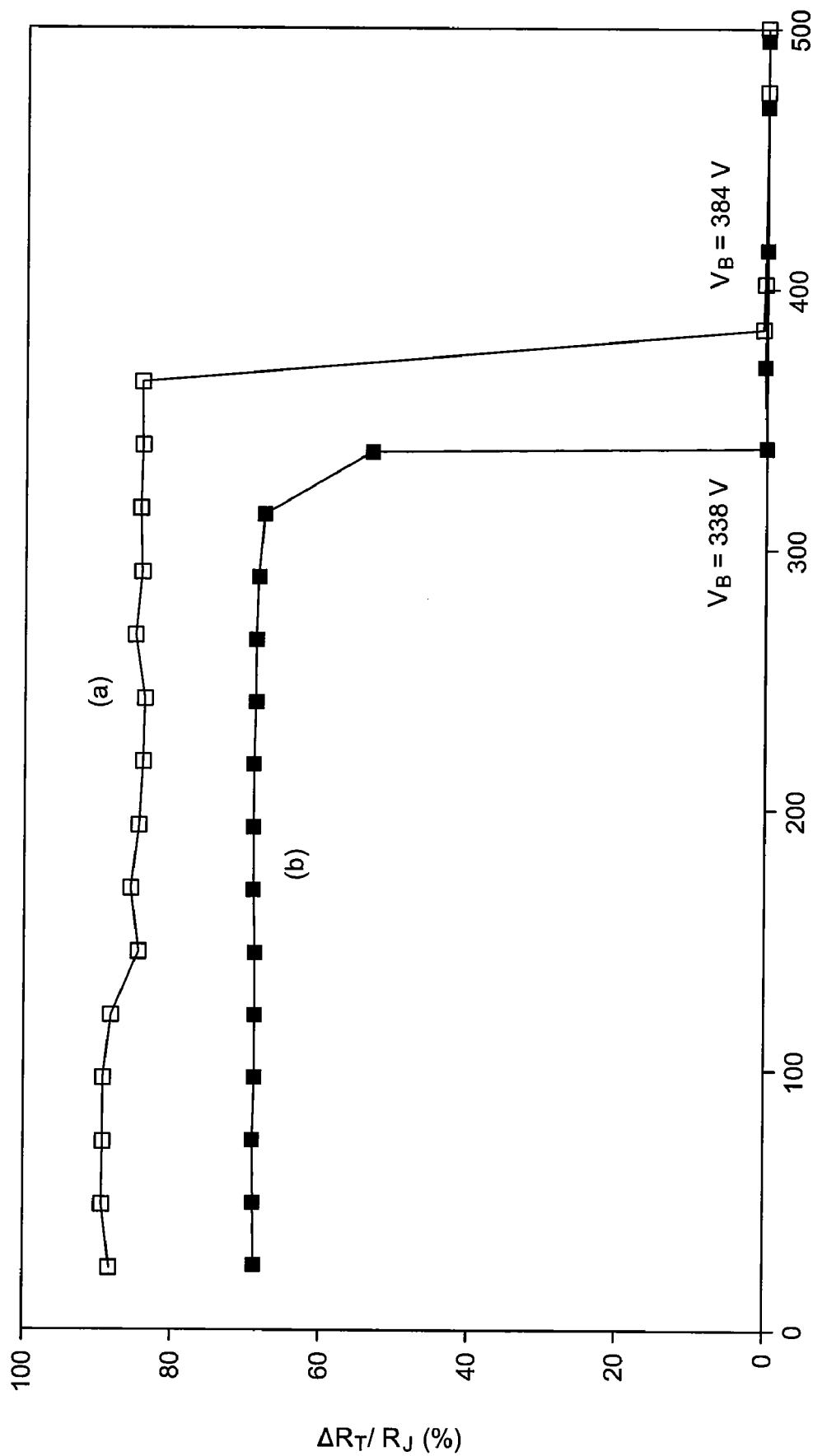
FIG. 6F is a graph of the TMR coefficient measured at an operating voltage versus the operating voltage for TMR sensors according to one embodiment of the invention.

FIG. 6F is a graph of the TMR coefficient ($\Delta R_T/R_J$) versus operation voltage ($V_O$) for (a) a TMR sensor according to one embodiment of the invention, and (b) a conventional TMR sensor. With respect to FIG. 6F, the TMR sensors are tested by applying $V_O$ increasing by every 20 mV in alternative directions. Their thermal stability is characterized by a critical voltage ($V_{90}$, where $\Delta R_T/R_J$ decreases to 90% of its original value). As depicted, the epitaxial growth exhibited by the multiple layers with an identical FCC structure causes an increase in $\Delta R_T/R_J$ at $V_O=20$ mV from 71.4% to 96.7%, and a decrease in $V_{75}$ from 227.3 to 183.2 mV. In spite of the lower $V_{75}$, the TMR sensor formed according to one embodiment of the invention in fact still exhibits $\Delta R_T/R_J$ at $V_{75}$ of as high as 72.5%, indicating higher thermal stability desired for magnetic recording at higher densities.

Figure 6G:
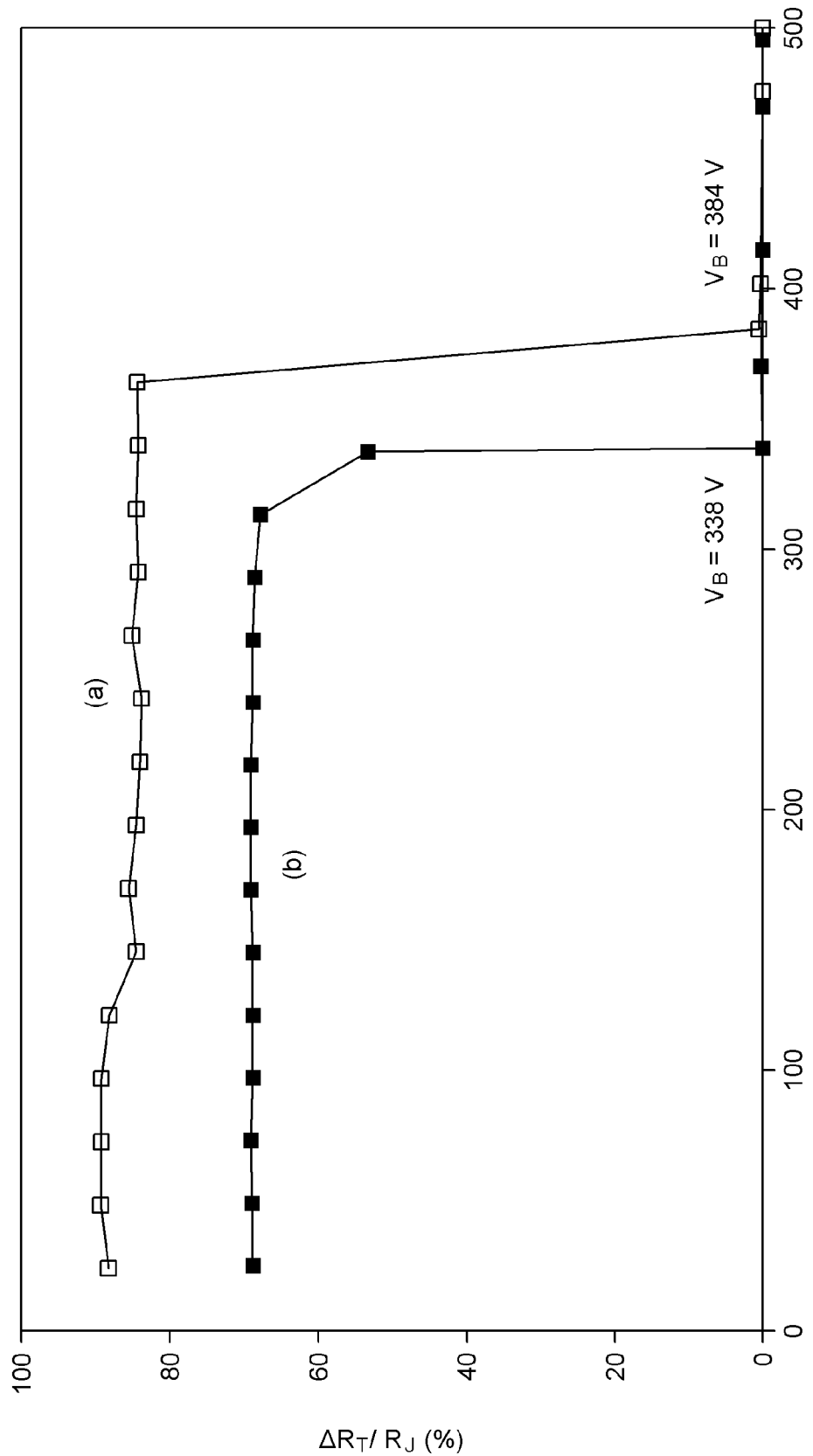
FIG. 6G is a graph of the TMR coefficient measured at 40 mV versus a stressing voltage for TMR sensors according to one embodiment of the invention.

FIG. 6G is a graph of the TMR coefficient ($\Delta R_T/R_J$) measured at 40 mV versus the stressing voltage ($V_S$) for (a) a TMR sensor according to one embodiment of the invention, and (b) a conventional TMR sensor. With respect to FIG. 6G, the TMR sensors are stressed by applying $V_S$ increasing by every 20 mV and staying for 100 ms at each $V_S$, and tested by applying $V_O$ of 40 mV after each stressing. Their thermal stability is characterized by a breakdown voltage ($V_B$), where the TMR effects are destroyed and thus $\Delta R_T/R_J$ becomes zero. As depicted, the epitaxial growth provided by the multiple layers with an identical FCC structure causes an increase in $V_B$ from 338 to 384 mV, thus providing higher thermal stability desired for magnetic recording at higher densities.

While the foregoing is directed to embodiments of the present invention, other and further embodiments of the invention may be devised without departing from the basic scope thereof, and the scope thereof is determined by the claims that follow.

What is claimed is:

1. A method for forming a current-perpendicular-to-plane (CPP) magnetoresistance sensor, comprising:
   providing a ferromagnetic shield layer;
   disposing one or more seed layers on the ferromagnetic shield layer;
   disposing a pinning layer on the one or more seed layers, wherein the pinning layer excludes PtMn; and
   disposing a pinned layer on the pinning layer; wherein the shield layer, each of the one or more seed layers, the pinning layer, and the pinned layer are comprised of compounds having face-centered-cubic structures.

2. The method of claim 1, wherein the one or more seed layers comprise:
   a first seed layer consisting of Ni—Fe—Cr; and
   a second seed layer consisting of Ni—Fe disposed on the first seed layer, wherein the pinning layer is disposed on the second seed layer.

3. The method for of claim 1, wherein the one or more seed layers comprise:
   a first seed layer comprising one or more nonmagnetic compounds with a face-centered-cubic structure, the compound nonmagnetic being selected from: Pt, Os, and Rh;
   a second seed layer comprising Ni—Fe—Cr; and
   a third seed layer comprising Ni—Fe disposed on the first seed layer, wherein the pinning layer is disposed on the second seed layer.

4. The method of claim 1, wherein the pinning layer consists of Ir—Mn—Cr.

5. The method of claim 1, wherein the shield layer consists of Ni—Fe.

6. A current-perpendicular-to-plane (CPP) magnetoresistance sensor, comprising:
   a ferromagnetic shield layer;
   one or more seed layers disposed on the ferromagnetic shield layer;
   a pinning layer disposed on the one or more seed layers, wherein the pinning layer excludes PtMn; and
   a pinned layer disposed on the pinning layer; wherein the shield layer, each of the one or more seed layers, the pinning layer, and the pinned layer are comprised of compounds having face-centered-cubic structures.

7. The sensor of claim 6, wherein the one or more seed layers comprise:
   a first seed layer comprising Ni—Fe—Cr; and
   a second seed layer comprising Ni—Fe disposed on the first seed layer, wherein the pinning layer is disposed on the second seed layer.

8. The sensor of claim 6, wherein the one or more seed layers comprise:
   a first seed layer comprising one or more nonmagnetic compounds with a face-centered-cubic structure, the compound nonmagnetic being selected from: Pt, Os, and Rh;
   a second seed layer comprising Ni—Fe—Cr; and
   a third seed layer comprising Ni—Fe disposed on the first seed layer, wherein the pinning layer is disposed on the second seed layer.

9. The sensor of claim 6, wherein the pinning layer comprises Ir—Mn—Cr.

10. The sensor of claim 6, wherein the shield layer comprises Ni—Fe.

11. A current-perpendicular-to-plane (CPP) giant magnetoresistance (GMR) sensor, comprising:
    a ferromagnetic shield layer;
    one or more seed layers disposed on the ferromagnetic shield layer;
    a pinning layer disposed on the seed layers, wherein the pinning layer excludes PtMn; and;
    a pinned layer disposed on the pinning layer;
    a spacer layer disposed on the pinned layer;
    a free layer disposed on the spacer layer; and
    a cap layer disposed on the free layer; wherein the shield layer, each of the one or more seed layers, the pinning layer, and the pinned layer comprise compounds having face-centered-cubic structures.

12. The CPP GMR sensor of claim 11, wherein the one or more seed layers comprise:
    a first seed layer comprising Ni—Fe—Cr; and
    a second seed layer comprising Ni—Fe disposed on the first seed layer, wherein the pinning layer is disposed on the second seed layer.

13. The CPP GMR sensor of claim 11, wherein the one or more seed layers comprise:
    a first seed layer comprising one or more nonmagnetic compounds with a face-centered-cubic structure, the compound nonmagnetic being selected from: Pt, Os, and Rh;
    a second seed layer comprising Ni—Fe—Cr; and a third seed layer comprising Ni—Fe disposed on the first seed layer, wherein the pinning layer is disposed on the second seed layer.

14. The CPP GMR sensor of claim 11, wherein the pinning layer comprising Ir—Mn—Cr.

15. The CPP GMR sensor of claim 11, wherein the spacer layer is formed from Cu—O.

16. The CPP GMR sensor of claim 11, wherein the shield layer comprises Ni—Fe.

17. A current-perpendicular-to-plane (CPP) tunneling magnetoresistance (TMR) sensor, comprising:
   a ferromagnetic shield layer;
   one or more seed layers disposed on the ferromagnetic shield layer;
   a pinning layer disposed on the seed layers, wherein the pinning layer excludes PtMn; and;
   a pinned layer disposed on the pinning layer;
   a barrier layer disposed on the pinned layer;
   a free layer disposed on the barrier layer; and
   a cap layer disposed on the free layer; wherein the shield layer, each of the one or more seed layers, the pinning layer, and the pinned layer comprise compounds having face-centered-cubic structures.

18. The CPP TMR sensor of claim 17, wherein the one or more seed layers comprise:
   a first seed layer comprising Ni—Fe—Cr; and
   a second seed layer comprising Ni—Fe disposed on the first seed layer, wherein the pinning layer is disposed on the second seed layer.

19. The CPP TMR sensor of claim 17, wherein the one or more seed layers comprise:
   a first seed layer comprising one or more nonmagnetic compounds with a face-centered-cubic structure, the nonmagnetic compounds being selected from: Pt, Os, and Rh;
   a second seed layer comprising Ni—Fe—Cr; and
   a third seed layer comprising Ni—Fe disposed on the first seed layer, wherein the pinning layer is disposed on the second seed layer.

20. The CPP TMR sensor of claim 17, wherein the pinning layer comprises Ir—Mn—Cr.

21. The CPP TMR sensor of claim 17, wherein the barrier layer comprises at least one of Al—O, Ti—O, and Mg—O.

22. The CPP TMR sensor of claim 17, wherein the shield layer comprises Ni—Fe.

23. A magnetic storage system, comprising:
   a magnetic storage medium having a plurality of tracks for recording data; and
   a current-perpendicular-to-plane (CPP) magnetoresistance sensor, comprising:
      a ferromagnetic shield layer;
      one or more seed layers disposed on the ferromagnetic shield layer;
      a pinning layer disposed on the one or more seed layers, wherein the pinning layer excludes PtMn; and
      a pinned layer disposed on the pinning layer; wherein the shield layer, each of the one or more seed layers, the pinning layer, and the pinned layer comprise compounds having face-centered-cubic structures.

24. The magnetic storage system of claim 23, wherein the one or more seed layers of the CPP magnetoresistance sensor comprise:
   a first seed layer comprising Ni—Fe—Cr; and
   a second seed layer comprising Ni—Fe disposed on the first seed layer, wherein the pinning layer is disposed on the second seed layer.

25. The magnetic storage system of claim 23, wherein the one or more seed layers of the CPP magnetoresistance sensor comprise:
   a first seed layer comprising one or more nonmagnetic compounds with a face-centered-cubic structure, the nonmagnetic compounds selected from: Pt, Os, and Rh;
   a second seed layer comprising Ni—Fe—Cr; and
   a third seed layer comprising Ni—Fe disposed on the first seed layer, wherein the pinning layer is disposed on the second seed layer.

26. The magnetic storage system of claim 23, wherein the pinning layer of the CPP magnetoresistance sensor comprises Ir—Mn—Cr.

27. The magnetic storage system of claim 23, wherein the shield layer of the CPP magnetoresistance sensor comprises Ni—Fe.

28. A method for forming a current-perpendicular-to-plane (CPP) magnetoresistance sensor, comprising:
   providing a ferromagnetic shield layer, wherein providing the ferromagnetic shield layer comprises:
      providing a layer of Ni—Fe; and
      disposing one or more Ta/Ni—Fe laminate films on the layer of Ni—Fe, wherein each Ta/Ni—Fe laminate film comprises:
         a Ta layer; and
         a Ni—Fe layer which is less than about 400 nm thick;
   disposing one or more seed layers on the ferromagnetic shield layer;
   disposing a pinning layer on the one or more seed layers, wherein the pinning layer excludes PtMn; and
   disposing a pinned layer on the pinning layer, wherein each of the one or more seed layers, the pinning layer, and the pinned layer consist of compounds having face-centered-cubic structures.

29. The method of claim 28, wherein the pinning layer consists of Ir—Mn—Cr.

30. The method of claim 28, wherein the one or more seed layers, the pinning layer, and the pinned layer exclude Ta.

31. The method of claim 28, further comprising:
   annealing the ferromagnetic shield layer, seed layers, the pinning layer, and the pinned layer.

32. The method of claim 28, further comprising:
   disposing a spacer layer on the pinned layer;
   disposing a free layer on the spacer layer; and
   disposing a cap layer on the free layer.

33. The method of claim 32, wherein the spacer layer is formed from Cu—O.

34. The method of claim 28, further comprising:
   disposing a barrier layer on the pinned layer;
   disposing a free layer on the barrier layer; and
   disposing a cap layer on the free layer.

35. The method of claim 34, wherein the barrier layer comprises at least one of Al—O, Ti—O, and Mg—O.

36. The method of claim 28, wherein the layer of NiFe is about 1,000 nm thick.

37. The method of claim 28, wherein the Ta layer is about 3 nm thick.

* * * * *